(12) United States Patent  (10) Patent No.: US 6,740,842 B2
Johnson et al.  (45) Date of Patent: May 25, 2004

(54) RADIO FREQUENCY POWER SOURCE FOR GENERATING AN INDUCTIVELY COUPLED PLASMA

(75) Inventors: Wayne L. Johnson, Phoenix, AZ (US); Leonard G. West, Cherry Hill, NJ (US)

(73) Assignee: Tokyo Electron Limited, Tokyo (JP)

( * ) Notice: Subject to any disclaimer, the term of this patent is extended or adjusted under 35 U.S.C. 154(b) by 148 days.

(21) Appl. No.: 10/043,270

(22) Filed: Jan. 14, 2002

(65) Prior Publication Data

US 2002/0125223 A1 Sep. 12, 2002

Related U.S. Application Data

(63) Continuation of application No. PCT/US00/18930, filed on Jul. 12, 2000.
(60) Provisional application No. 60/143,548, filed on Jul. 13, 1999.

(51) Int. Cl.[7] ............................................... B23K 10/00
(52) U.S. Cl. ........................ 219/121.54; 219/121.57; 219/121.43; 315/111.51; 156/345.45; 118/723 I
(58) Field of Search ....................... 219/121.54, 121.57, 219/121.52, 121.43, 121.41, 121.4; 315/111.21, 111.51; 118/723 I; 156/345.44, 345.45

(56) References Cited

U.S. PATENT DOCUMENTS

| 3,467,471 A | * | 9/1969 | Greenfield et al. ...... 315/111.51 |
| 3,826,993 A | | 7/1974 | White |
| 3,909,664 A | | 9/1975 | Waskiewicz et al. |
| 3,921,092 A | | 11/1975 | Schatz |
| 3,958,883 A | | 5/1976 | Turner |
| 4,337,415 A | | 6/1982 | Durr |
| 4,433,916 A | | 2/1984 | Hall |
| 4,500,408 A | | 2/1985 | Boys et al. |
| 4,551,690 A | | 11/1985 | Quist |
| 4,626,728 A | | 12/1986 | Flachenecker et al. |
| 4,629,887 A | | 12/1986 | Bernier |
| 4,629,940 A | | 12/1986 | Gagne et al. |
| 4,766,287 A | | 8/1988 | Morrisroe et al. |
| 4,801,897 A | | 1/1989 | Flecken |
| 4,808,258 A | | 2/1989 | Otsubo et al. |
| 4,808,948 A | | 2/1989 | Patel et al. |

(List continued on next page.)

FOREIGN PATENT DOCUMENTS

| EP | 281 157 | 9/1988 |
| EP | 568 920 A1 | 11/1993 |
| EP | 569 920 B1 | 11/1993 |

OTHER PUBLICATIONS

Lieberman & Lichtenberg, Chaper 12—Inductive Discharges," Principle of Plasma Discharges and Materials Processing," John Wiley & Sons, Inc., 1994, pp. 387–409.
"Vacuum–Tube Oscillators," Chapter XI of Principles of Electrical Engineering Series Applied Electronics, a First Course in Electronics, Electron Tubes and Associated Circuirts by Members of the Staff of the Department of Electrical Engineering, MIT, John WIey & Sons, Inc., New York, 1943, pp. 596–623.
Reference Data for Radio Engineers, Howard W. Sams & Company, 1975, Section 24, pp. 28–30.

Primary Examiner—Mark Paschall
(74) Attorney, Agent, or Firm—Pillsbury Winthrop, LLP (57) ABSTRACT

A system for converting DC power (22) into an RF electromagnetic field in a processing chamber, the system being composed of: a coil (16) constructed to surround the processing chamber; and an RF power generator (20) including a free-running oscillator (26) having a DC power input and an RF power output, the power output connected to a load impedance which includes the coil for supplying RF current to the coil at a frequency which is dependent on the load impedance.

23 Claims, 9 Drawing Sheets

U.S. PATENT DOCUMENTS

| | | |
|---|---|---|
| 4,818,916 A | 4/1989 | Morrisroe |
| 4,866,346 A | 9/1989 | Gaudreau et al. |
| 5,001,649 A | 3/1991 | Lo et al. |
| 5,095,890 A | 3/1992 | Houghton et al. |
| 5,155,547 A | 10/1992 | Casper et al. |
| 5,180,949 A | 1/1993 | Durr |
| 5,223,457 A | 6/1993 | Mintz et al. |
| 5,383,019 A | 1/1995 | Farrell et al. |
| 5,432,451 A | 7/1995 | McGill et al. |
| 5,444,337 A * | 8/1995 | Ogawa et al. ............... 315/349 |
| 5,519,215 A | 5/1996 | Anderson et al. |
| 5,688,357 A | 11/1997 | Hanawa |
| 6,065,425 A | 5/2000 | Takaki et al. |

* cited by examiner

RADIO FREQUENCY POWER SOURCE FOR GENERATING AN INDUCTIVELY COUPLED PLASMA

This application is a Continuation of PCT/US00/18930, which was filed on Jul. 12, 2000, which designated the U.S., and U.S. provisional application No. 60/143,548, which was filed on Jul. 13, 1999, contents of both of which are incorporated in their entirety by reference.

BACKGROUND OF THE INVENTION

The present invention relates to the generation of inductively coupled plasmas in apparatus for performing etching and deposition processes.

A variety of semiconductor fabrication operations involve deposition and etching processes performed on a semiconductor substrate mounted within a process chamber. Such processes typically involve the use of a low pressure, high density discharge wherein a plasma is generated by the interaction of an ionizable gas with a radio frequency (RF) electromagnetic field. The coupling of RF power to a plasma in semiconductor process chambers can be categorized as either predominantly capacitive or predominantly inductive. Many examples of each can be found in the prior art.

In the case of capacitive coupling, RF power is coupled to the bottom plate and/or the top plate of a parallel plate process chamber. In general, the top plate also serves as the ionizable gas feed, the bottom plate serves as the wafer holding chuck and the remainder of the chamber is grounded.

Figure 1A:
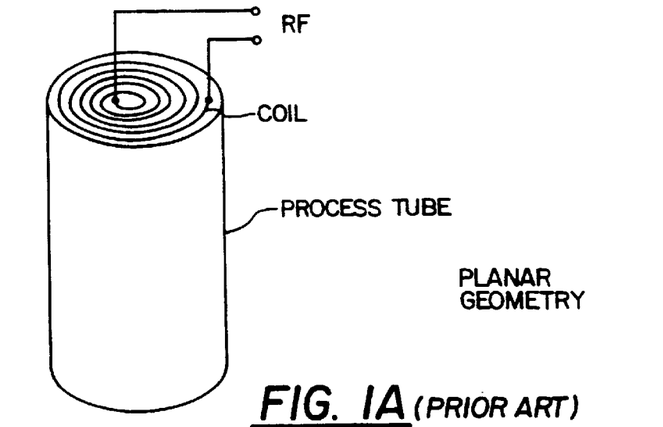
FIGS. 1A, 1B and 1C are simplified pictorial view of three prior art plasma generating system configurations.
Figure 1B:
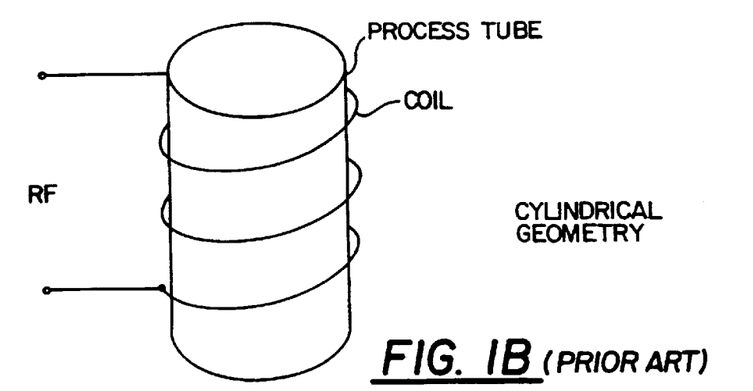
Figure 1C:
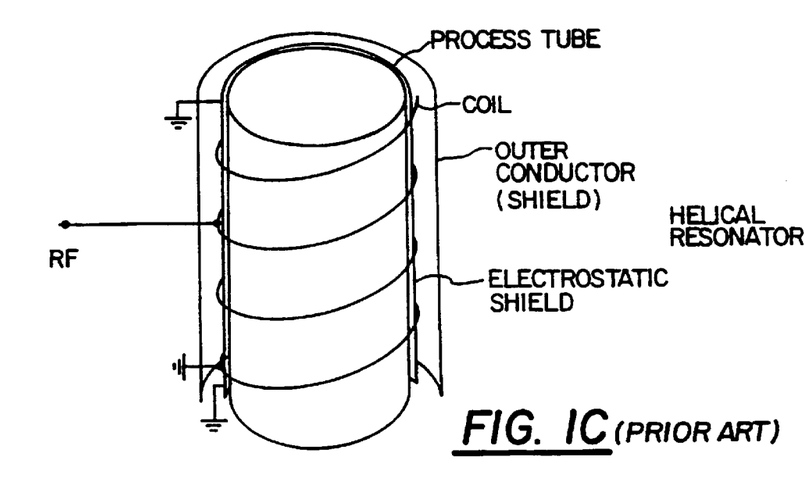

Inductive coupling generally employs a planar geometry, or a cylindrical geometry, or a combination of the two geometries. Furthermore, low RF power is usually applied to a bottom electrode, or chuck, to provide a RF bias. FIGS. 1A, 1B and 1C present some examples of the inductive discharge geometries.

FIG. 1A illustrates an example of planar geometry in which a planar multi-turn coil is located at the top of a process tube, or process chamber. FIG. 1B shows an example of cylindrical geometry in which a multi-turn cylindrical coil is wound around a process tube, while FIG. 1C shows a modified version of cylindrical geometry in which the cylindrical coil is surrounded by a conductive shield. The structure shown in FIG. 1C is an example of a helical resonator. In each of the illustrated arrangements, the coil is connected to receive a RF current and, thence, to induce an electromagnetic (EM) field parallel to the longitudinal axis of the cylindrical geometry. This resultant RF EM field, that is a manifestation of the RF current in the coil, consists primarily of radially propagating EM waves proximate to the plasma volume when polarized by an electrostatic shield (to remove the azimuthally propagating field). The radially propagating waves interact with a small thin surface layer of the bulk plasma. The thickness of this thin layer is often referred to as the skin depth. This interaction ultimately leads to energized electrons and subsequent gas ionization, and the formation of a plasma. In general, a process tube acts as a protective barrier and delineates the inner plasma volume from the external structure. At least in the structures of FIGS. 1B and 1C, the process tube is made of a dielectric material that is transparent to the electromagnetic energy emanating from the coil. It will be understood that these figures are schematic. Actual equipment can take a variety of forms in practice.

The coupling of RF power to a plasma in semiconductor processing is conventionally at a drive frequency of 13.56 MHz, using a 50 Ω RF power generator. This frequency is conveniently located within a RF band designated for industrial use. However, the frequency of operation is not limited to this value in the prior art and, in fact, multiple frequencies are employed typically when using multiple coupling electrodes.

RF power is typically supplied to the coil by an oscillator having at least one active component that may be a solid state, or semiconductor, component, or a vacuum tube.

As is known in the art, energy can be inductively coupled into a process chamber through a helical resonator as described in Lieberman & Lichtenberg, Chapter 12 (*Principles of plasma discharges and materials processing*, John Wiley & Sons, Inc., 1994). With a helical resonator, the coil (or helix) has a length equal to an integral number of quarter waves of the RF input. The coil surrounds the plasma chamber and is encased within a cylindrical container that is grounded. FIG. 1C shows the basic structure of such a helical resonator including the coil, an electrostatic shield enclosed by the coil to minimize capacitive coupling of the RF field with the plasma, a dielectric process tube that is enclosed by the electrostatic shield and separates the helical coil from the plasma, an outer conductor, or shield, surrounding the coil and an RF input line connected to a tap of the coil. As shown in FIG. 1C, the coil tap to which the RF input is applied is spaced from one end of the coil which is grounded. The portion of the coil between the coil tap and ground effectively serves as part of the matching circuit, thus the tap position can be selected to achieve a match condition. Under a given set of conditions, proper definition of the tap point location can provide impedance matching for the circuit.

However, the load impedance on a RF power generator is a function of the intrinsic impedance of the coil and the impedance presented by the plasma, the latter impedance being a function of the properties of the plasma. Therefore, fluctuations in the process conditions can lead to fluctuations in the impedance as seen by the RF power generator. Furthermore, the impedance of the process chamber, in which the plasma is established, varies significantly between the condition prior to plasma ignition and the run condition. In order to maintain efficient energy transfer from the RF power generator to the plasma, proper matching of the power supply output impedance to the load impedance is required.

One technique used in the prior art is a variable frequency power supply. The frequency is determined by a phase mag detector that determines the match conditions at the input of a fixed match network coupling to the tap of the coil. However, systems of this type can be very expensive, and hence a fixed frequency power supply is generally employed in conjunction with a match network.

Figure 2:
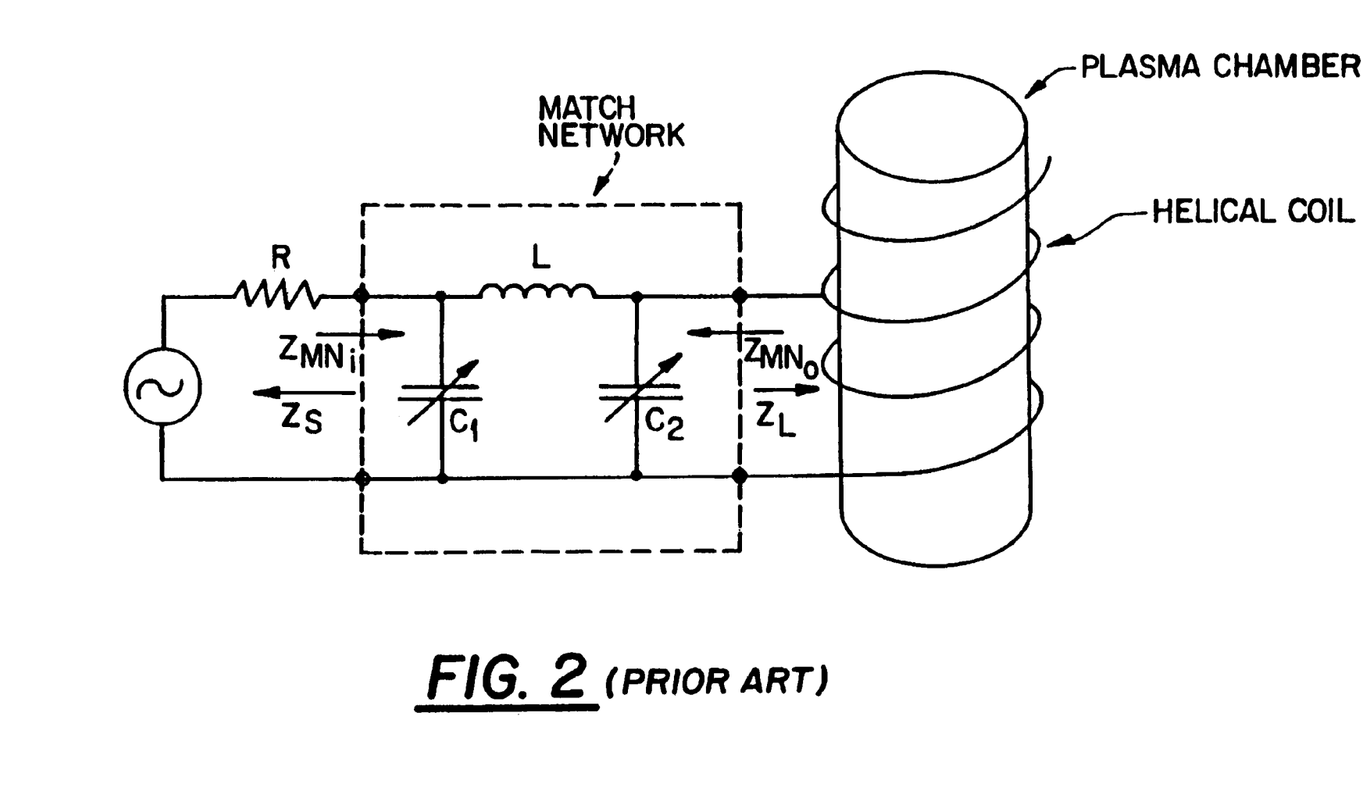
FIG. 2 is a circuit diagram of a prior art fixed frequency RF power generator.

An example of a fixed frequency RF oscillator coupled to the coil of a helical resonator via an impedance matching network is shown in FIG. 2. The matching network is a π-filter composed of a series connected inductor, L, and two shunt connected variable capacitors $C_1$ and $C_2$. The matching network compensates for differences between the variable load impedance represented by the coil and the plasma, and the output impedance of the RF power generator. For example, as shown in FIG. 2, when the source impedance $Z_s$ is equal to the load impedance $Z_{MNi}$, this impedance including the impedances of the match network, the helical coil and the plasma load, then the power transfer can be maximized. In this particular case, the input impedance to the match network-load circuit $Z_{MNi}$ is the complex conjugate of the source impedance $Z_s$, and the output impedance of the match network $Z_{MNo}$, as seen by the load, is the complex conjugate of the load impedance $Z_L$. Under this special condition, the coupling between the RF source and the combination of the match network and the plasma loaded coil can be represented as equivalent to a purely resistive circuit. Hence, the matching network is designed to maximize power transmission from the RF power generator to its load.

Given feedback of the power transfer state (reflected/transmitted power levels using special detector circuits whose outputs approximate the difference in phase between the forward and reflected signals and the magnitude of the reflected signal), matching networks have been developed to respond to changes in the load impedance. In particular, during plasma ignition and run conditions, the variable capacitors are adjusted to tune the load circuit, which includes the impedance match network, the coil and the plasma load, to a resonant condition for the fixed frequency power supply. When the circuit impedances are matched, power reflected to the source at the match network juncture is minimized, or even zero, depending upon the accuracy of the match, thus reducing damage to the power supply, which must ultimately absorb this reflected power. It is known, however, that the use of a matching network with a fixed frequency power supply presents a number of problems for the manufacturers of semiconductor equipment.

Specifically, existing impedance matching networks are inherently unreliable, due in part to the fact that the maintenance required to assure operating reliability is relatively complex and often beyond the capabilities of maintenance personnel.

Furthermore, know n matching networks have an inadequate response time, at least in certain operating situations. In particular, if the power supplied to the plasma source is to be varied according to a pulse pattern, then the fastest matching networks cannot adjust to maintain an optimum match between the power supply and the plasma source. This is true because the time scale for the fastest match networks is several hundreds of milliseconds, i.e., the rise or fall time for a response is approximately several hundred milliseconds. However, to achieve a RF square wave pulse to within one percent accuracy, the minimum pulse time scale for these match networks might be several tens of seconds or 25 to 50 seconds. Therefore, in order to accurately achieve millisecond pulsing, one requires a match network with rise and fall times, or a time scale, of the order of microseconds. Therefore, it has been necessary to accept power coupling conditions that are inefficient and that are even variable from pulse to pulse or from run to run.

If an impedance mismatch should occur during substrate processing, substrate damage will be the likely result.

The use of a variable frequency RF power generator alleviates many of the problems encountered when employing a fixed frequency RF power generator and a match network. U.S. Pat. No. 5,688,357 (Hanawa) discloses a method of using a variable frequency RF power generator composed of a solid state oscillator in conjunction with a control system that includes a method of sensing the reflected and/or transmitted power. The control system adjusts the frequency of the RF power source until the reflected power is minimized and/or the transmitted power is maximized. A disadvantage of present solid state technology is the fact that RF power supplies having a solid state component are suitable for handling relatively low power levels, of the order of 5 kW. However, power supplies capable of generating higher power levels, for example up to 15 kW, are necessary to process wafers having diameters of 300 mm. An alternative to the use of a solid state oscillator is the use of a vacuum tube as the active component within an oscillator circuit that includes the load coil and plasma load.

Vacuum tube oscillators have been employed for more than 50 years to convert direct-current (DC) power to alternating-current (AC) power. A complete discussion of the design of vacuum tube oscillators may be found in "Vacuum-Tube Oscillators" (Chapter XI of Principles of Electrical Engineering Series Applied Electronics, A First Course in Electronics, Electron Tubes and Associated Circuits by Members of the Staff of the Department of Electrical Engineering, MIT, John Wiley & Sons, Inc., New York, 1943). According to the literature, vacuum tube oscillators have been categorized in two classes, namely negative-resistance oscillators and feedback oscillators. For particular use in the processing of semiconductors using low pressure plasma discharges, feedback oscillators can comprise a vacuum tube as an amplifier and a coupling circuit wherein the coupling circuit includes the load coil, which may be a helical coil or electrical components that couple the RF power with a plasma. Examples of typical feedback oscillators are the: Hartley oscillator, Colpitts oscillator, tuned-grid oscillator, and tuned-grid tuned-plate oscillator. Basic circuits for known Hartley and Colpitts oscillators are shown in FIGS. 3A and 3B, respectively, which are found in Vacuum-Tube Oscillators, supra.

The basic premise behind the operation of a feedback-oscillator is that the device acts as an amplifier wherein a portion of the output power is fed back as input to the amplifier such that oscillations may be maintained. Hence, any device capable of a periodic output with an output power greater than the input power required to drive the oscillations may be referred to as self-excited. More precisely, if a component of the output power is fed back to, for example, the cathode of the vacuum tube with the proper magnitude and phase, then oscillations can be sustained. Sometimes, it is useful to view the feedback connected vacuum tube oscillator as a negative-resistance element.

Figure 3A:
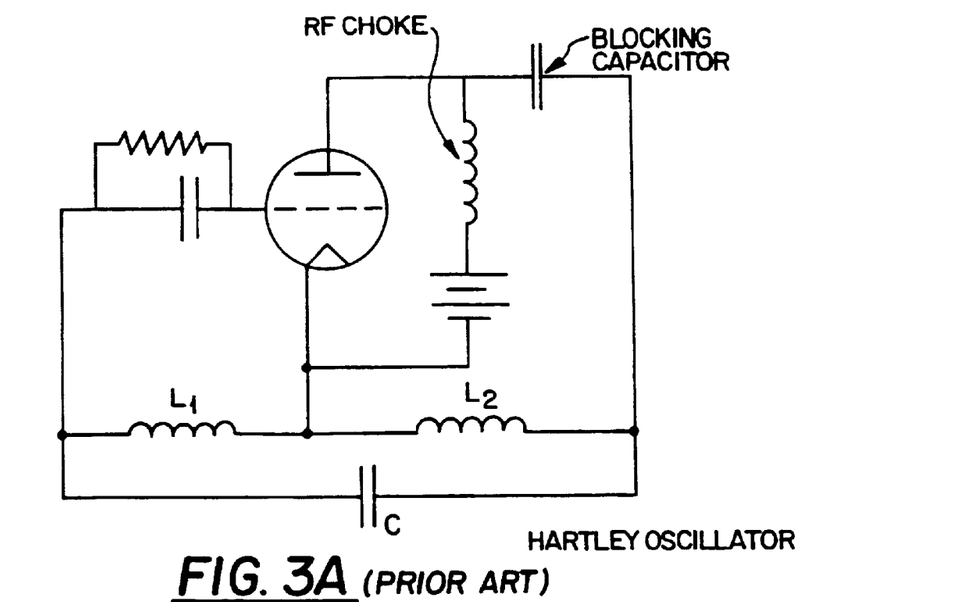
FIGS. 3A and 3B are circuit diagrams of two prior art vacuum tube oscillators.
Figure 3B:
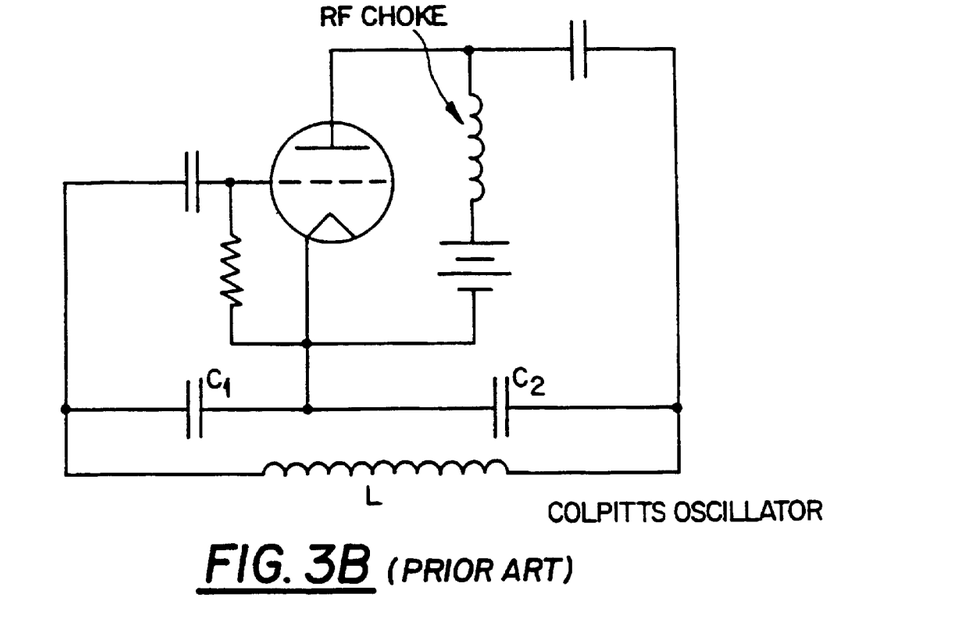
Figure 4A:
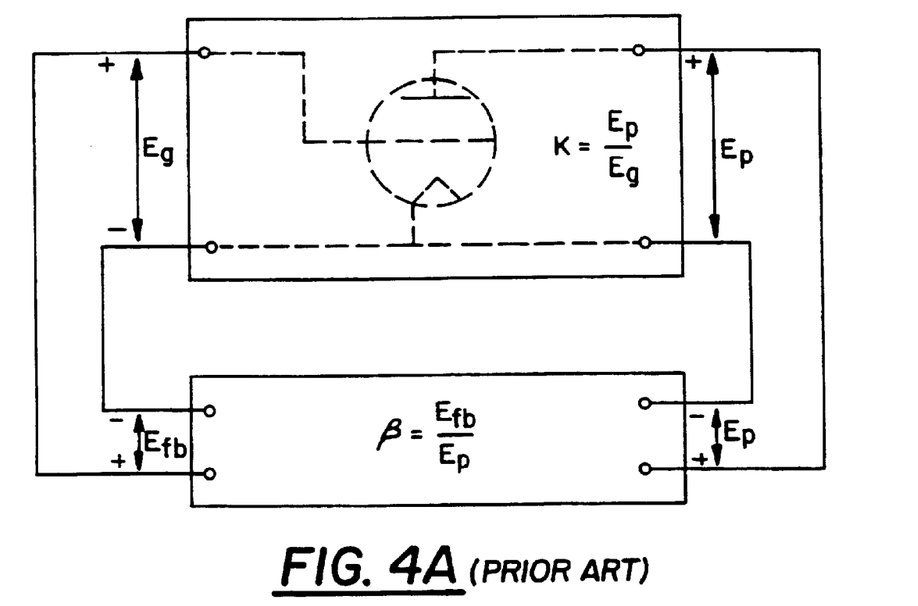
FIGS. 4A and 4B are, respectively, a circuit diagram and an equivalent circuit diagram of the oscillator shown in FIG. 3A.
Figure 4B:
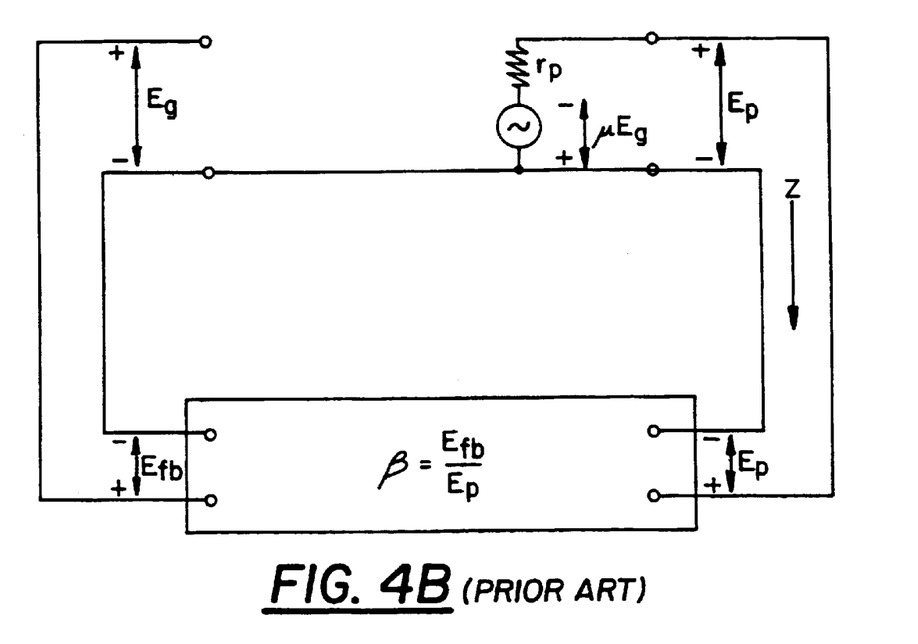

FIGS. 4A and 4B present a simplified schematic diagram and an equivalent circuit diagram, respectively, of a feedback oscillator corresponding to the Hartley oscillator shown in FIG. 3A. FIGS. 4A and 4B are also found in Vacuum-Tube Oscillators, supra. In FIG. 4A, the circuit is composed of a vacuum tube amplifier and a coupling network. As shown, the vacuum tube amplifier has an output voltage $E_p$ (plate to cathode), an input voltage $E_g$ (grid to cathode), and a voltage gain $K=E_p/E_g$. The coupling network sees an input voltage $E_p$ and has an output voltage of $E_{fb}$, where $\beta=E_{fb}/E_p$ is the voltage ratio of the coupling network. In order to generate self-excited oscillations, the voltage gain of the amplifier K must be at least equal to the inverse of the feedback voltage ratio $\beta$, or $K \geq 1/\beta$.

FIG. 4B presents an equivalent circuit diagram of the same circuit as FIG. 4A. However, it assumes the circuit to be a linear Class A circuit. Substituting for the value of K in the circuit of FIG. 4B, it is possible to show the following condition for sustained oscillations, commonly referred to as the Barkhausen criterion, $$\beta(\omega) = \left(\frac{1}{\mu} + \frac{1}{g_m Z(\omega)}\right), \quad (1)$$

where Z is the impedance of the load circuit, and $\mu$ and $g_m$ the gain and the mutual conductance, respectively, of the vacuum tube. Clearly, β is a complex voltage ratio, since the impedance more than likely includes reactive components, wherein the real and imaginary parts must be independently equal to satisfy equation (1). These two criteria place constraints on the magnitude and phase, and hence define a necessary condition for operation. In fact, sometimes the real part of equation (1) sets the condition for the mutual conductance of the tube $g_m$, and the complex part of equation (1) generally sets the frequency of operation.

As shown in FIG. 3A, the load circuit of the Hartley oscillator whose impedance is Z comprises two inductors $L_1$ and $L_2$ in parallel with a capacitor C, wherein the common node between the two inductors is directly connected to the vacuum tube cathode.

In connection with plasma generation in spectrometers, European patent EP 568920A1 (Gagne) discloses the use of a triode vacuum tube within a Colpitts oscillator circuit for coupling RF power to an atmospheric plasma. However, the oscillation circuit is disclosed as having a poor efficiency, approximately 40 to 60%, for coupling power to the plasma. Additionally, when designed as a feedback oscillator for coupling RF power to a low pressure, high density plasma, the Colpitts oscillator was unable to transition from a plasma ignition condition to a run condition without manual circuit tuning. In order to overcome these problems and improve the robustness of the oscillator circuit, a Hartley oscillator has been employed to enable automatic transition between start and run conditions. Furthermore, the Hartley oscillator circuit was found to be more efficient; approximately 78%.

BRIEF SUMMARY OF THE INVENTION

It is an object of the present invention to provide a plasma generating system with a RF power generator which alleviates the drawbacks and shortcomings noted above.

Another object of the invention is to provide such a system with a RF power generator that can generate high power levels, in the range of 15 kW and higher, but is less costly than existing power supplies capable of operating at such power levels A further object of the invention is to provide a RF high power generator that is capable of power transfer to the plasma source, while adjusting rapidly to changes in the RF power level, e.g. with match network time scales of the order of one or several microseconds, and continuously maintaining a matched impedance coupling circuit during variations in the plasma source impedance.

It is a further object of the invention to provide a RF generator that operates stably during start and run conditions and is capable of automatic transition between start and run conditions without manual tuning of the circuit.

The above and other objects are achieved, according to the present invention by a system for converting DC power into a RF electromagnetic field in a processing chamber, the system comprising:

a coil constructed to surround the processing chamber for coupling RF power into the plasma; and a RF power generator including a free-running oscillator having a DC power supply and an RF power output, the power output being connected to a load impedance which includes the coil, the RF power generator being operative for supplying RF current to the coil in order to generate the RF power that is coupled into the plasma, wherein:

the free-running oscillator comprises: a vacuum tube having a cathode, a plate and a grid; a grid-leak circuit connected to the grid; a feedback circuit coupled to the vacuum tube; and a DC supply circuit connected for heating the cathode; and at least a part of the coil is connected to form a part of the feedback circuit.

According to the preferred embodiments of the invention, the RF power generator is located proximate to the processing chamber, while the DC power supply may be disposed at a location remote from both the processing chamber and the RF power generator. However, the DC power supply may be placed at any location, including adjacent to the chamber. The size of the DC power supply is a function of the required RF power level and, hence, it can become quite large when 15 kW RF power is to be generated for wafer processing.

In order to achieve the desired RF power output levels, i.e. RF power ramps or pulsed RF power, a RF power generator according to the invention may utilize, as its active component, a triode vacuum tube having a control grid wherein the grid-bias voltage can be modulated using a wave-form generator. The active component can also be a tetrode, pentode, etc having single or multiple control grids, solid state transistors, FETs, or similar gain devices. According to preferred embodiments of the invention, the vacuum tube free running oscillator is a modified Hartley oscillator.

It has been found that the use of a free-running oscillator eliminates the need for any matching network and allows the oscillator output to be directly connected to the inductive coil, and thus directly coupled to the plasma source.

When conditions change in the processing chamber, there will be a corresponding change in the plasma impedance, and hence a corresponding change in the load impedance of the oscillator circuit. In addition to being a function of the vacuum tube parameters, the frequency at which oscillations are sustained is a function of the load impedance. Therefore, during stable operation, the RF frequency of the free-running oscillator will automatically adjust to such changes.

A system according to the present invention offers a number of advantages over the prior art, including improved reliability, consistency of performance from one unit to another, speed of response to power level variations, and the ability to monitor plasma conditions by measuring the oscillator output frequency.

The ability of a free-running oscillator to vary its oscillation frequency rapidly with changes in load impedance, without relying on mechanically adjustable components, results in a more reliable matching of the RF power generator output impedance to the impedance of the plasma source and thus allows a more accurate control of the power delivered to the plasma. In addition, the elimination of mechanically adjustable components and related control circuits significantly improves system reliability and reduces system fabrication costs.

In other words, the response of the RF feedback oscillator is dependent only on the rate at which the plasma impedance can change and the time constants of various circuit elements. For example, the time scale associated with such changes in plasma impedance may be tens of microseconds during run conditions, and as long as 1 millisecond during start operation. Thus, the use of a free-running oscillator allows efficient transfer of power to the plasma source even when the RF power is supplied in the form of pulses having a duration of 3 to 5 milliseconds, or less if 1% accuracy is not required, and with rise and fall times as short as 30 and 50 microseconds, respectively. The RF power generator can respond satisfactorily to power level variations and pulses having a duration of 3 to 5 milliseconds and can operate satisfactorily even when the RF power is pulsed between different power levels with a complex, multi-level, cyclic or non-cyclic time function.

Furthermore, since the RF frequency produced by the RF power generator varies with the plasma source impedance, the RF frequency can be monitored to provide an indication of variations in plasma conditions. This can be particularly helpful to the extent that the RF frequency can be correlated to specific plasma source parameters.

Although the present invention offers numerous advantages, it is in order to note that, in the present state of the art, high power vacuum tube RF oscillators require regular maintenance performed by highly trained personnel. In addition, under certain operating conditions, the oscillator output frequency may be modulated at frequencies outside the ISM Band designated for industrial RF use. However, this problem can be alleviated by proper RF shielding around the power supply and process chamber. This RF shielding may, for example, be in the form of a copper mesh and/or a copper plate wall, enclosing the plasma chamber.

This shielding is not specifically shown in the drawings. However, in accordance with principles already known in this art, all the RF components, namely, the coil, cables, the RF oscillator and oscillator circuit elements would conventionally have appropriate shielding, i.e., would be enclosed within metal boxes, coax cable, etc. There may still be some RF leakage, and if its magnitude is sufficiently large then further shielding may be required, possibly in the form of a copper plate wall and/or mesh shielding the entire chamber. RF shielding is standard practice for most process chambers.

DETAILED DESCRIPTION OF THE INVENTION

Figure 5:
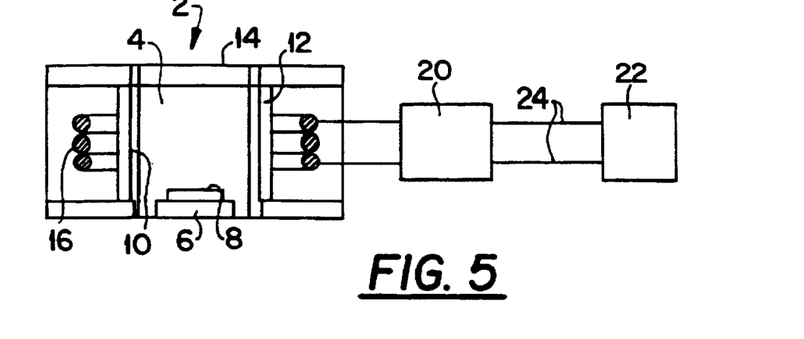
FIG. 5 is a block diagram of system according to the invention coupled to a processing chamber.

FIG. 5 is a block diagram of a system for generating a RF electromagnetic field according to the invention, together with a processing chamber 2 in which a plasma is to be created by means of the electromagnetic field. Chamber 2 encloses a processing region 4 in which the plasma is to be formed. Within region 4 there is provided a substrate support 6 on which a substrate 8 is mounted. Substrate 8 may be a semiconductor wafer on which a plasma-assisted process is to be performed. Region 4 is surrounded by a process tube 10, which is, in turn surrounded by an electrostatic shield 12. Chamber 2 is provided, at the upper boundary of region 4, with a gas injection assembly 14 for injecting an ionizable processing gas into region 4. This processing gas will be ionized by a RF electromagnetic field within region 4 and the resulting ions will be propelled toward the substrate 8 under the influence of electric fields created by suitable components (not shown) within region 4. Such components are already well-known in the art.

All of the elements described thus far, and all other systems and components needed to perform a plasma-assisted etching or deposition operation, and not pertaining to the contribution of the present invention, may be constituted by components well-known in the art.

The required electromagnetic field is generated by supplying a RF current to a coil 16 wound around region 4 and shield 12 and constituting one component of a RF electromagnetic field generating system according to the invention. In order to generate this RF electromagnetic field, coil 16 is connected to output conductors of a RF power generator 20 and operating power is delivered to generator 20 from a DC power supply 22.

In the illustrated embodiment, coil 16 is a helical, or solenoidal, coil. However, it is to be understood that coil 16 can have any form suitable for generating a plasma in a processing chamber.

According to preferred embodiments of the invention, RF power generator 20 is mounted directly adjacent to reactor 2, while DC power supply 22 may be disposed at a location remote from power generator 20 and coupled to power generator 20 by conductors 24. However, it is not necessary to locate DC power supply 22 at such a remote location. It may, in fact, be placed locally adjacent to reactor 2.

Figure 6:
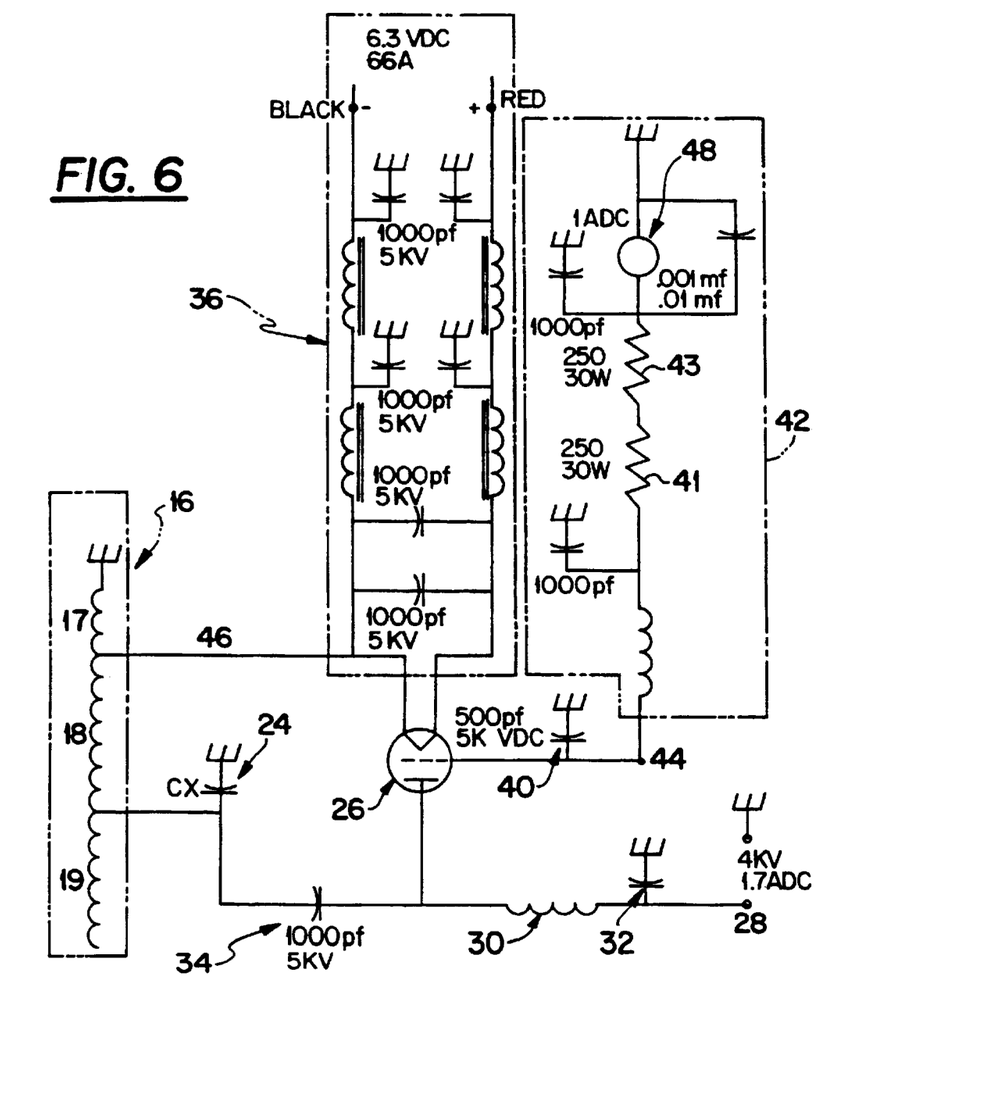
FIG. 6 is a circuit diagram of one preferred embodiment of a free-running oscillator of the system shown in FIG. 4.

RF power generator 20 is constituted essentially by a free-running oscillator which has, as its active component, a triode power vacuum tube 26. A preferred embodiment of the oscillator circuit of the invention described herein is shown in FIG. 6. It has a configuration similar to the Hartley oscillator described earlier herein; however, it is different in that the electrical components which comprise the load circuit include the plasma coupling element, namely helical coil 16 and the plasma.

The circuit shown in FIG. 6 is a modified version of the Hartley oscillator shown in FIG. 3A. The Hartley oscillator circuit is one example of a larger class of feedback-oscillators. One characteristic feature of the Hartley oscillator is the divided inductance ($L_1$ and $L_2$ in FIG. 3A; 17 and 18 in FIG. 6) which is divided at a node which is connected to the cathode of triode vacuum tube 26. The fundamental basis for the operation of a feedback oscillator is described in "Vacuum-Tube Oscillators", Chapter XI, supra.

The circuit presented in FIG. 6 consists of several components each requiring detailed description. These components are as follows: (i) a DC power supply (component 22 in FIG. 5, not shown in FIG. 6) having an output connected between terminal 28 and ground; (ii) a lowpass filter composed of a shunt capacitor 32 and a RF choke inductor 30; (iii) a triode vacuum tube 26; (iv) a load circuit including a blocking capacitor 34, a circuit tuning capacitor 24, helical coil 16 coupled to plasma processing reactor 2, and a feedback connection from helical coil 16 to the cathode of triode vacuum tube 26; (v) a grid capacitor 40 and a grid-leak circuit 42' and (vi) a low DC resistance, high AC impedance cathode heating circuit 36.

In FIG. 6, an exemplary set of component values, and input voltage and current values for the circuit are indicated for 5 kW RF power.

The free-running oscillator has a single active component, which is a triode power vacuum tube 26 having a plate, a cathode and a control grid. As is well-known in this art, a potential applied to the control grid will influence the magnitude of current flow between the cathode and plate when a suitable operating voltage exists between the cathode and plate. Typically, the cathode of such a triode will be made of thoriated tungsten.

One practical example of a triode vacuum tube that may be used as tube 26 is a Siemens RS3010C RF vacuum tube.

The output, or load, circuit of tube 26 is constituted by capacitors 34 and 24 and portion 18 of coil 16. Specifically, capacitor 34 and coil portion 18 are connected in series between the plate and cathode of tube 26, capacitor 24 is connected in series between capacitor 34 and ground and coil portions 17 and 18 are connected in series between capacitor 34 and ground. In addition, capacitor 24 and coil portion 17 are both connected to ground and thus effectively form a series branch in parallel with the first-mentioned part of coil 16.

The connections employed are intended to correspond to those of a Hartley oscillator configuration. The point of connection to the helical coil will determine the effective inductance between the connection from blocking capacitor 34 and the connection to the cathode, and the effective inductance from the connection to the cathode to ground. Such split inductances are inherent to the Hartley oscillator, and their values affect the oscillator performance.

Blocking capacitor 34 is employed to decouple DC power from the load circuit. Variable capacitor 24, identified in FIG. 6 as having a capacitance "CX", is employed to adjust the impedance Z described in equation (1). In doing so, an operating oscillation frequency can be adjusted for a given set of nominal conditions (i.e., RF power, chamber conditions, etc.). The load coil, or helical coil, 16 is divided into three portions, namely, the open end portion 19, the portion 18 between an input tap connected to capacitors 24 and 34 and the feedback tap connection 46, and the portion 17 extending from the feedback tap connection to ground at the external conducting wall or shield for the plasma source. Coil 16 is a helical coil that is wrapped about the plasma chamber.

Figure 7A:
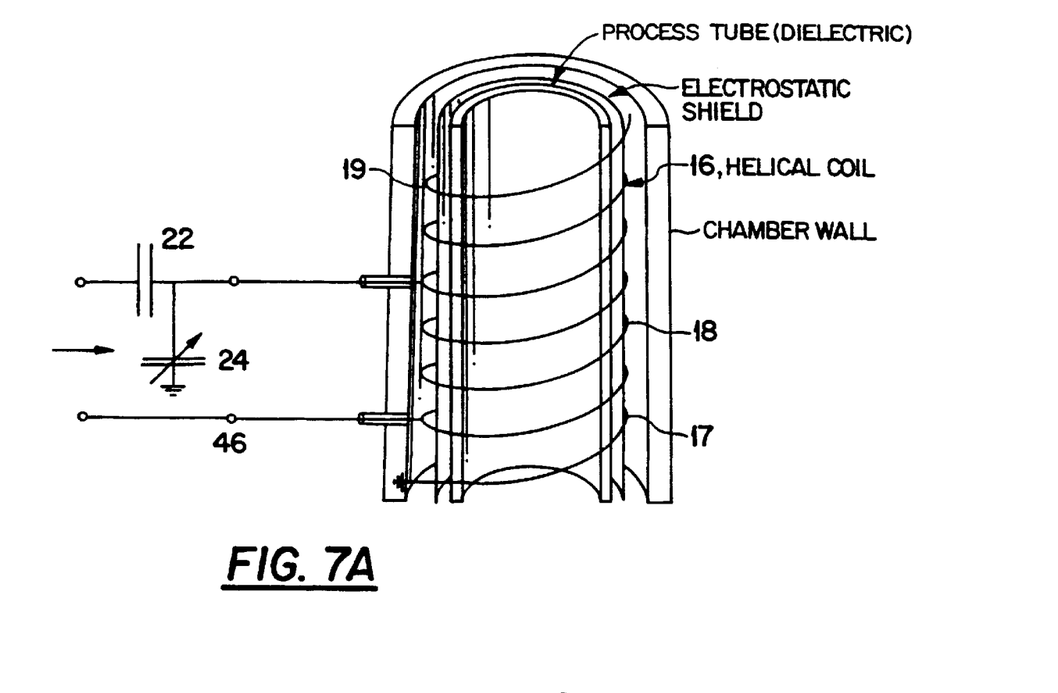
FIG. 7A is a partly pictorial, partly circuit schematic illustration of a plasma generating system connected to components of the circuit of FIG. 6.
Figure 7B:
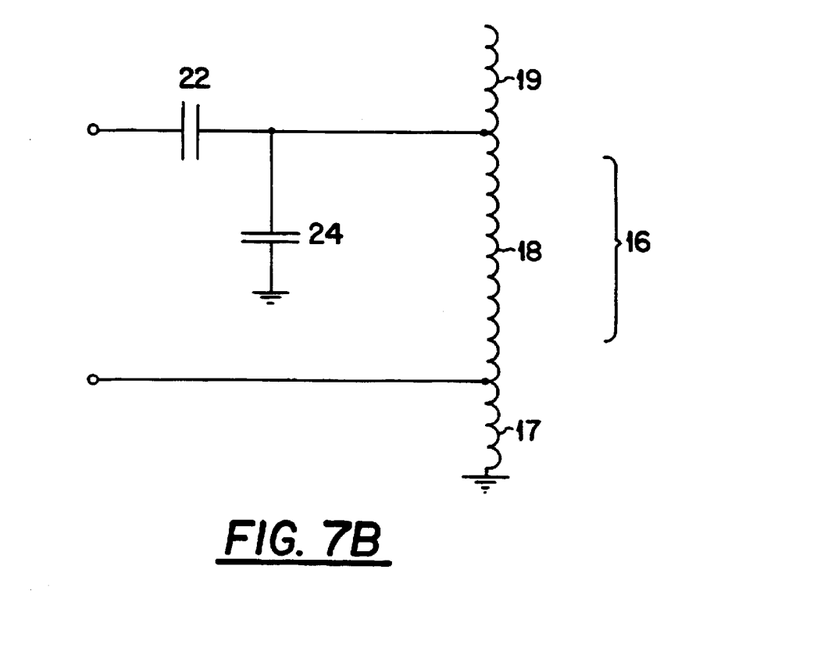
FIG. 7B is a circuit diagram of the electrical components shown in FIG. 7A.

FIG. 7A presents a schematic of a helical resonator wherein helical coil 16 is wrapped around an electrostatic shield and a process tube, the latter being made of a dielectric material and being enclosed by the electrostatic shield. Coil 16 is surrounded by a chamber wall and is connected to the input tap position and the feedback connection 46 of the free-running oscillator. The chamber has an outer wall made of conductive material and the end of portion 17 of coil 16 is connected to that outer wall. A circuit schematic of the components of FIG. 7A is shown in FIG. 7B. Coil portions 17 and 18 represent the split inductance common to the Hartley oscillator, and portion 19 is simply the open end of a helical resonator. Of course, there will be mutual inductance with the plasma during run conditions. As described earlier with reference to FIG. 1C, a helical resonator is composed of a shield, or outer conductor, which in this case is the conductive chamber wall, and a coil, or inner conductor, which in this case is coil 16, enclosed by the shield. One end of coil 16 is directly connected to ground, or to the shield. The opposite end of coil 16 is open-ended, unless a trimming capacitor is employed.

Figure 8A:
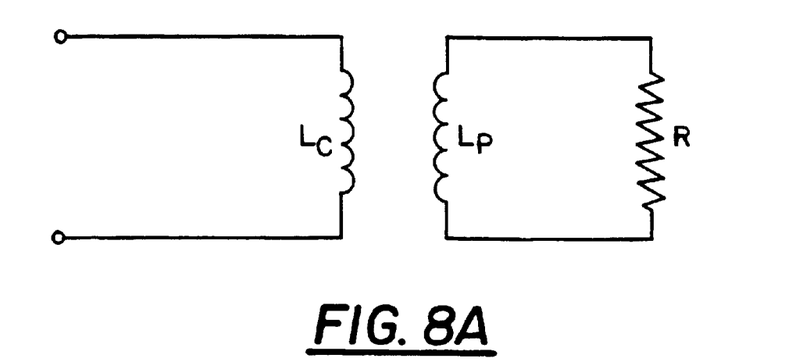
FIGS. 8A and 8B are equivalent circuit diagrams illustrating the theory of operation of a RF power generator according to the invention.
Figure 8B:
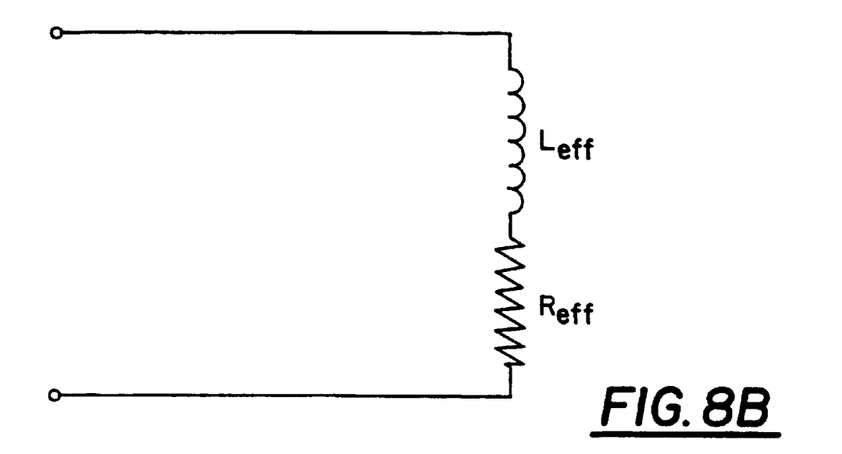

Overall, the system behaves similar to a quarter wave coaxial transmission line resonator (see Reference Data for Radio Engineers, Howard W. Sams & Company(1975) Section 24, pages 28–30) The capacitance associated with the capacitive coupling of the helical coil with the outside conductor and the inductance of the coil cooperatively form an LC circuit wherein the resonant frequency becomes $\omega = (LC)^{-1/2}$ In order to understand the load circuit and its coupling with the entire oscillator circuit and to determine whether sustained oscillations are possible and what oscillation frequency is obtainable, a simplified circuit diagram can be drawn to include the effects of the plasma. For example, in the case of the inductively coupled plasma source shown in FIG. 1C, where the outer conductor is a conductive chamber wall, the physical system presented in FIG. 1C can be represented by the simplified circuit diagram shown in FIG. 8A (see Lieberman & Lichtenberg, *Principles of plasma discharges and materials processing*, John Wiley & Sons, Inc., 1994, p. 393, FIG. 12.2). This is commonly referred to as a transformer coupled circuit model of the inductive discharge. The inductive coil is represented by the inductor $L_c$ that is coupled to the plasma through the plasma inductance $L_P$. The plasma is, of course, represented by circuit elements $L_P$ and R. This circuit is further simplified in FIG. 8B wherein the circuit of FIG. 8A is replaced by an effective inductor and resistor in series. Using an equivalent electrical circuit model of the plasma, one can estimate the load impedance as seen by the amplifier circuit, and subsequently design the overall oscillator circuit to have sustained oscillations for a given frequency at some nominal set of conditions.

Operating power is supplied to tube 26 from a conventional high-voltage DC power supply 22 (not shown in FIG. 6) the output of which power supply is connected between power input terminal 28 and ground. Terminal 28 is connected via RF choke coil 30 to the plate of tube 26 and filter capacitor 32 is connected between terminal 28 and ground. Coil 30 and capacitor 32 serve as a low pass filter which decouples the DC power source from the AC portion of the oscillator. A DC path between the cathode of tube 26 and ground is provided by portion 17 of coil 16, as illustrated.

Proper operation of a vacuum tube power triode requires that its cathode be heated in order to function as an effective electron emitter. The cathode of tube 26 is heated by a DC voltage supplied to the cathode from a suitable voltage source (not shown) via a current delivery circuit 36. Circuit 36 is composed of a group of inductors forming a series circuit path with the cathode between positive and negative input terminals of circuit 36, together with a series of shunt-connected capacitors. In effect, circuit 36 provides a very low DC resistance between its input terminals and the cathode, the cathode also having a very low DC resistance, so that a heating current having a high magnitude can be generated by a relatively low DC voltage. Circuit 36 essentially serves to provide AC decoupling between the high frequency portions of the oscillator and the DC voltage source.

The oscillator circuit of FIG. 6 further includes grid bias capacitor 40 connected between the grid of tube 26 and ground and grid-leak circuit 42 also connected between the grid of tube 26 and ground.

The simple analysis provided earlier herein related to a linear Class A amplifier. However, ordinarily a grid leak circuit 42 and grid capacitor 40 are used to supply a grid-bias voltage. Therefore, the introduction of this non-linear circuitry causes the behavior of the oscillator circuit to immediately violate Class A tube operation. The non-linearity arises simply due to the rectification of the current flow into the grid-leak circuit, as will be discussed in greater detail below. The non-linear behavior adds two desirable effects to the operation of the oscillator circuit. Firstly, it adds a stabilizing effect; in other words it limits the amplitude of the sustained oscillations. For example, if the circuit behaves linearly, there is no element to restrain the amplitude growth of the most unstable frequency mode of the circuit. Secondly, the use of a grid-bias voltage enables the tube to be operated with greater efficiency such that it has Class C performance. The improvement to the efficiency stems from the fact that the frequency for sustained oscillations becomes closer to the resonant frequency of the tuned circuit.

Finally, the grid of tube 26 is connected to an input terminal 44 provided for connection to a grid voltage generating circuit that may be constructed to supply the grid with a constant magnitude DC bias voltage, or a voltage having a selected waveform, such as a pulsed waveform, a complex, multilevel waveform, a sinusoidal waveform, etc., as will be discussed in greater detail below.

For a given plate-cathode operating voltage, the level of current through tube 26 will increase as the potential on the triode grid becomes more positive. When the potential on the grid is positive with respect to the cathode potential, some of the current from the triode cathode will charge capacitor 40 and flow through leak circuit 42. When the potential on the triode grid is negative with respect to the cathode potential, there will be no electron flow into leak circuit 42. Thus, during periods of a RF cycle when the grid bias is positive with respect to the cathode potential, capacitor 40 will be charged to a negative potential relative to ground and current will then slowly leak from capacitor 40 through leak circuit 42 during other portions of the RF cycle.

The capacitance of the capacitor 40 should be large enough to have negligible reactance at the operating frequency in comparison to the grid-leak resistance. This is equivalent to stating that the time constant of the grid-bias circuit must be sufficiently larger than a RF oscillation period. Under these conditions, some charge on capacitor 40 builds up; that is the rate at which charge is lost to the grid-leak circuit is smaller than the charge received from the grid during a fraction of the RF cycle. Therefore, as the charge on capacitor 40 increases, the negative grid bias voltage increases, thus reducing the grid-current pulses. Eventually, a steady-state condition is reached wherein the charge lost to the grid-leak circuit balances the charge received during a RF cycle. At this point, a steady component of current acts through the grid-leak circuit and the alternating component acts through grid capacitor 40. Typically, a current meter 48 can be employed to measure and monitor the steady component of current through the grid-leak circuit. The direct current is a measure of the relative amplitude of the oscillations in the circuit and can be used to detect the presence of oscillations.

In order to prepare the oscillator shown in FIG. 6 for use in a plasma processing system, it is only necessary to tune capacitor 24 to a selected nominal oscillation frequency, which may be, for example, 13.56 Mhz. Upon completion of this initial circuit tuning, no additional tuning is required during plasma processing operations. As shown by equation (1), above, variations in the load impedance directly affect the feedback voltage ratio β. In order to sustain oscillations, the frequency of oscillation must change to compensate for these changes in the impedance Z. Of course, as the frequency changes, the impedance varies as well.

At the start of operation, electronic noise in the circuit generates an initial perturbation and a preferred wavelength is amplified. Persistence of the resulting oscillation depends on whether the gain of the feedback voltage is greater than unity. As conditions in the plasma vary, so does the potential across the electron tube due to the feedback and, subsequently, the electron tube self-adjusts the oscillation frequency.

Thus, the frequency produced by the free-running oscillator will automatically adjust to changes in the characteristic impedance of the plasma source, so as to maintain optimum, or close to optimum, energy coupling between the oscillator and the plasma within region 4.

One advantage provided by the RF power generator according to the invention is that the free-running oscillator can adjust to changes in the magnitude of the DC driving power much more quickly than oscillators which utilize mechanically operated impedance matching networks. In particular, a free-running oscillator according to the present invention can adjust to a given waveform definition within 1% accuracy in a period of 3 to 5 milliseconds. This implies that an adjustment will be made over a course of 100 steps, each step having a rise time of approximately 30 to 50 microseconds.

A free-running oscillator according to the present invention can, when the tuning capacitor has been properly adjusted at the outset, respond to plasma impedance changes as the gas pressure in an Argon atmosphere in the plasma region varies between 0.1 mTorr to 50 mTorr. The specific circuit illustrated in FIG. 6, with the capacitance and resistance values depicted therein, can respond to a pressure variation range of between 1 and 17 mTorr. Only minor adjustments need be made to the circuit to shift this range either up or down in order to obtain operating characteristics within at least a portion of the pressure range initially stated herein.

As is known in the art, the density of a plasma is dependent upon several operating parameters including the level of RF power coupled into the plasma, the gas pressure within the processing chamber, etc. In particular, the plasma density is directly affected by the amount of power absorbed, $P_{abs}$. Therefore, if one considers the first law of thermodynamics, the balance of energy between the RF power, $P_{in}$, produced by oscillator section 20 and that which is absorbed by the plasma, then $P_{in}$-$P_{abs}$. Therefore, monitoring the temperature of certain components can provide some information regarding the amount of power lost to heat or at least a fraction of the lost power converted to heat. However, use of the plasma processing system requires methods of cooling certain regions of the system to maintain temperature stability. For example, the RF oscillator section 20 can experience a significant temperature rise, wherein substantial heating occurs by power dissipated within the triode vacuum tube and the grid resistors. During operation of the plasma system, the dissipated power is sufficient to generate an appreciable temperature rise of the components within the RF oscillator section 20. The RF oscillator section 20 consists essentially of all circuit components shown in FIG. 6 except for the DC power supply, the helical coil and the plasma. Furthermore, the helical coil and process chamber typically require cooling. In general, the helical coil is immersed within a recirculating bath of coolant fluid (e.g., Fluorinert™). The temperature of the coolant fluid is related to the amount of power dissipated.

Ideally, it would be desirable to directly measure plasma density. However, this requires the mounting of additional sensing devices on or in the processing chamber, such as, for example, a Langmuir probe which would be mounted to protrude into the plasma space and would require an electrical feed through the chamber wall, or a less intrusive microwave system. However, any plasma density measuring device adds to the complexity and cost of the resulting system.

In a system according to the present invention, the oscillation frequency of the free-running oscillator circuit is a function of several parameters including the gain and mutual conductance of the triode vacuum tube, and the load impedance of the circuit. The load impedance of the circuit depends upon various circuit elements, namely the blocking capacitor, the variable capacitor, the helical coil, and of course the plasma. Certainly, plasma variations, for example changes in plasma density, affect the plasma impedance, and hence the load impedance. Therefore, it is possible to detect changes in the oscillation frequency and correlate them with changes in the plasma density. However, as described earlier, the input power is ultimately dissipated in the form of heat, i.e. a fraction of power is dissipated in the external circuit and the remaining power heats the plasma. Without sufficient cooling of the vacuum tube, grid resistors and helical coil, the temperature of the structure can be variable. Generally, the process chamber operates under conditions far from thermal equilibrium. The variations in temperature certainly affect operating parameters of the vacuum tube and affect elements of the system that comprise the load impedance of the circuit. These variations, in turn, affect the oscillation frequency and magnitude of the RF output from the generator. Therefore, it is important to maintain these components at a constant temperature, or at least at a pre-selected temperature having small variations that have a negligible effect upon the oscillation frequency.

If the plasma density can be precisely controlled, it becomes possible to intentionally modulate the plasma density or to stabilize the plasma density at a selected value. In the former case, it may be desired to adjust the RF power by delivering a signal in the form of a voltage pulse, ramp, or more complex waveform from the DC power source while maintaining all other parameters onstant. Thus, varying the power supplied to the plasma varies the plasma density and this varies the oscillator frequency. According to another possibility, it may be desired to set one of the input parameters, such as chamber pressure or the DC power level supplied to the RF power generator, in order to simply stabilize the plasma density at a selected, constant value.

Figure 9:
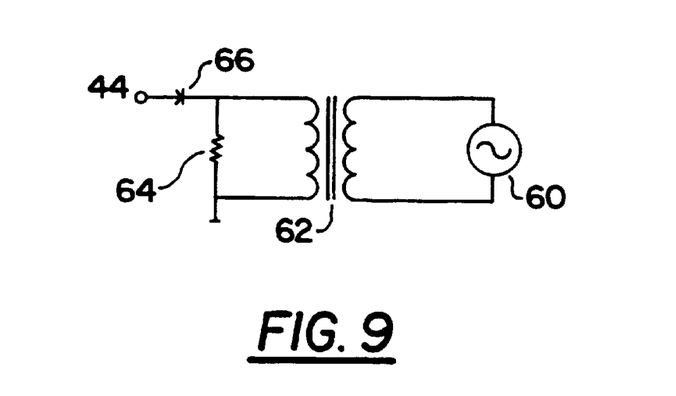
FIG. 9 is a circuit diagram of a component usable with the oscillator of FIG. 6.

Alternatively, such a signal may be applied to the grid of tube 26 by a grid voltage control circuit, one nonlimiting example of which is shown in FIG. 9. This circuit includes a pulse waveform generator 60 coupled to terminal 44 of FIG. 6 via a transformer 62, a shunt-connected resistor 64 and a series-connected capacitor 66. Resistor 64 and capacitor 66 constitute, essentially, a simple highpass filter. Generator 60 can be implemented to deliver to the grid of tube 26 a variable voltage which varies periodically according to any pattern, including a square wave pattern, a complex, multi-level waveform whose segments have any desired duration, or a sinusoidal pattern. Such generators are already well known in the art.

When the temperatures of the oscillator and the plasma generating system are maintained constant, input parameters such as chamber pressure or RF power can be controlled more accurately. Over the pressure range of 1 to 17 mTorr, in the circuit shown in FIG. 6, the oscillator frequency varies over a range of 200 kHz. If the oscillator frequency could be controlled within a tolerance of 2 kHz, it would become possible to control the oscillator frequency to within 1% accuracy by appropriately varying the chamber pressure. During the operation of a practical embodiment of a system according to the invention, the sustained frequency of the oscillator shown in FIG. 6 was observed to vary with the coolant temperature at a rate of 6.66 kHz per degree C. over a temperature range for the coolant fluid from 5 to 30° C. This temperature range was measured when a bias shield was present. This shield is generally a slotted shield similar to the electrostatic shield, however, unlike the electrostatic shield it is not grounded but rather connected to a RF generator through a blocking capacitor and match network. Furthermore, the slots of the bias shield are cut wider than those of the electrostatic shield and aligned with those of the electrostatic shield to allow passage of EM energy generated by the coil. The bias shield may be biased, unbiased (floating) or grounded. In general, it is utilized to bias the walls to attract ion bombardment for cleaning purposes and its presence simply varies the electrical properties of the structure.

Thus, if it were desired to control the oscillator frequency to within 1% while maintaining the plasma density (or pressure, power, etc.) within consistent limits, it would be necessary to maintain the temperature of the cooling system constant to within 0.3° C., which is a difficult requirement to satisfy. However, such control can be achieved using cooling techniques for the helical resonator such as that disclosed in a copending U.S. Provisional Application No. 60/095,036, entitled "ESRF Chamber Cooling System", filed by Johnson on Aug. 3, 1998. Such control enables the oscillator frequency to be an indication of plasma variations, i.e. those associated with pressure, power changes, etc. If the temperature is maintained stable within certain limits, there will not be any temperature dependent frequency variations.

Figure 10A:
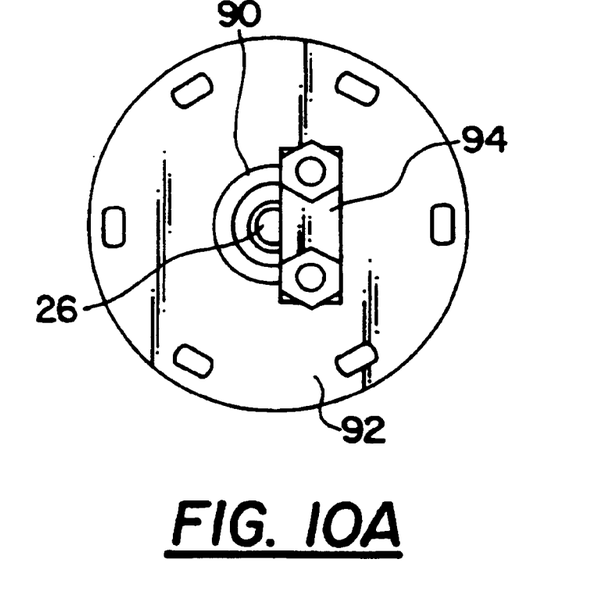
FIGS. 10A and 10B are an end view and a side elevational view, respectively, of a vacuum tube component that may be employed in the free-running oscillator of FIG. 6.
Figure 10B:
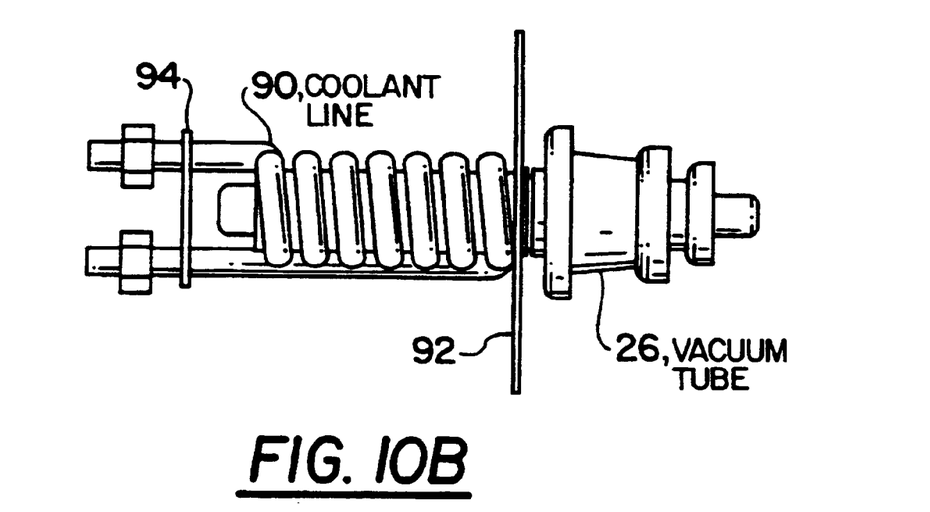

Furthermore, cooling must be provided for the RF oscillator section 20 in order to maintain a stable temperature for the remainder of the oscillator circuit. One method of maintaining a constant tube temperature would be to wrap a copper tube about the triode vacuum tube and to provide a flow of coolant fluid at a high flow rate through the copper tube. One fluid could be chilled water maintained at a temperature of, for example, 25° C. The same copper tube, or coolant line, may continue on to pass through a copper block upon which the grid resistors 41 and 43 are mounted, as shown in FIG. 6. This would provide sufficient cooling for the vacuum tube and the grid resistors. Both components can dissipate a substantial fraction of the input DC power. For example, the power dissipated within the tube can be as great as 1 kW and the power dissipated by the grid resistors might be as great as 300 W. FIG. 10A is an end view and FIG. 10B is a side view showing one suitable configuration for triode vacuum tube 26 and a coolant tube 90. Tube 26 is supported in the oscillator housing by a support plate 92 and tube 90 is wrapped around tube 26. The free ends of tube 90 are supported by a plate 94. The arrangement illustrated may be constituted by a unit marketed by Siemens Inc. under the model designation RS-3010-CJ.

Assuming satisfaction of this limitation on the coolant temperature and the temperature of RF oscillator 20, the oscillator frequency may be employed as a control function for controlling the plasma density and the oscillator frequency can be controlled by properly adjusting the chamber pressure and/or RF input power. Prior to operating a system according to the invention, a database will be developed for the given apparatus, which database provides a correlation between the plasma density and various combinations of oscillation frequency, chamber pressure and RF input power. Assuming that it is intended to change from an initial plasma density value to an ending plasma density value by executing 100 steps between the two values, this being in order to achieve a 1% accuracy, each plasma density step is defined and correlated with frequency and pressure steps. Using the value of the pressure step, a predetermined valve characteristic can be used to control the opening and closing of a high vacuum valve communicating with the interior of the plasma chamber. Then, the high vacuum valve can be operated to adjust the pressure between steps with fine-tuning at each step. A similar approach can be employed if it is desired to control plasma density as a function of RF power variations. In fact, the use of RF power to adjust the plasma density is the best mode of operation since the control system will have the best response times. The response times for the FRO can be approximately tens of microseconds.

Figure 11:
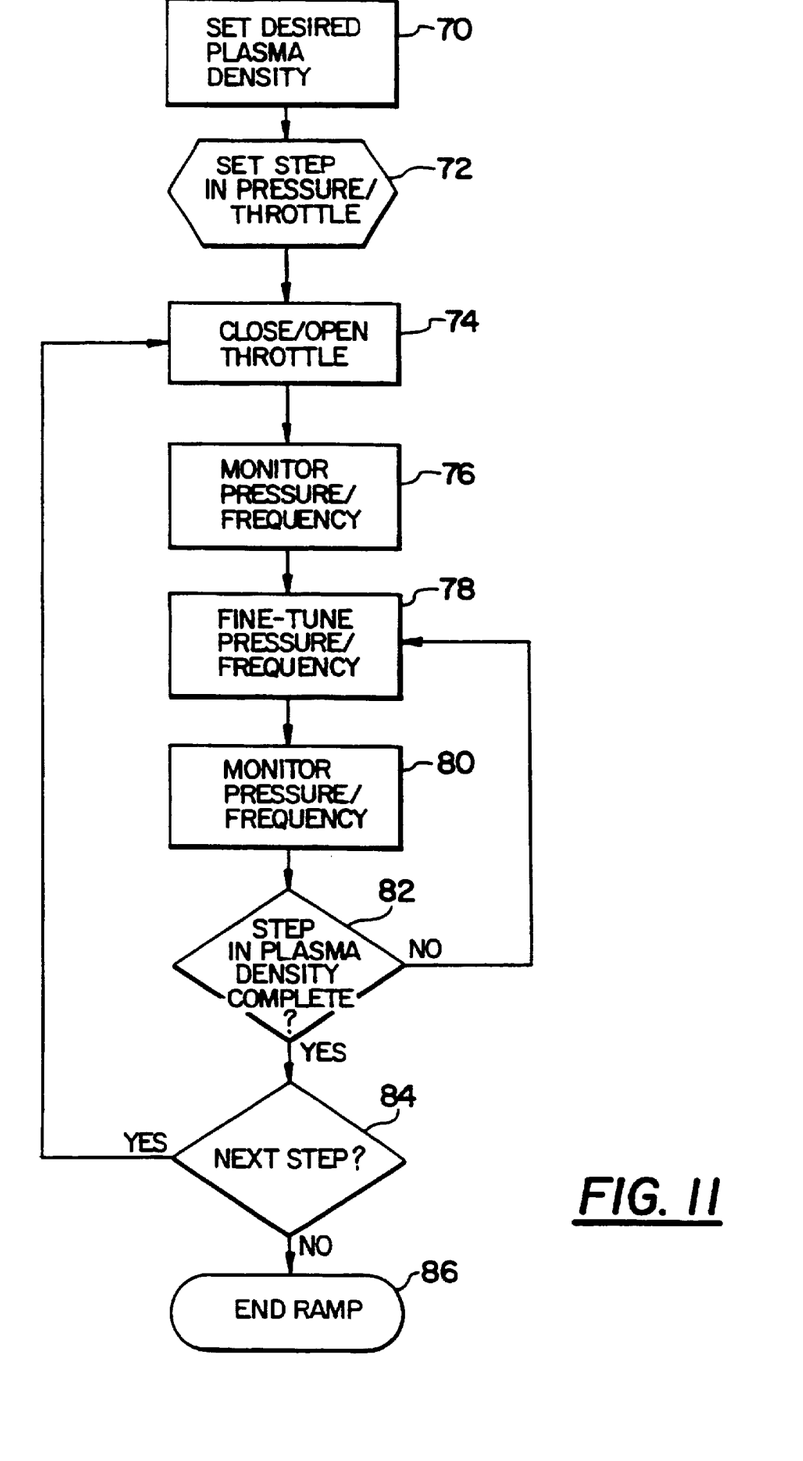
FIG. 11 is a programming flow diagram illustrating a plasma density control procedure according to the present invention.

One specific example of such a procedure is illustrated in FIG. 11. According to the illustrated procedure, the desired plasma density is set in step 70 after which a correlation between each step and the associated pressure change is set in step 72. Then, in step 74 a throttle, or valve, is opened and closed, followed by monitoring, in step 76, the pressure in the plasma region and the oscillator output frequency. Then, a coarse tuning may be performed, followed by a fine tuning of the pressure and frequency in step 78. The coarse tuning of the control circuit can be based upon a predetermined correlation between the oscillation frequency, plasma density and RF input power. The fine tuning simply includes an iterative procedure wherein a pre-set plasma density is obtained to within some pre-selected tolerance as a function of the oscillation frequency. The iterative procedure can be any appropriate known control procedure, i.e., predictor-corrector, etc. The pressure and frequency are again monitored in step 80 and a determination is made whether the plasma density step variation has been completed in decision block 82. If not, operation returns to step 78. If the plasma density step variation has been completed, operation proceeds to block 84 where it is determined whether a next step is to be performed. If a next step is to be performed, operation returns to step 74, otherwise the procedure is ended at step 86, or may be repeated with pressure being replaced by RF power.

It has been found that the oscillator illustrated in FIG. 6 is capable of operating with a DC input power level as low as 10–30 W. Moreover, operation of the oscillator is stable even in the presence of rapid changes in power level and pressure. Under start-up conditions, significant changes in gas density within region 4 can occur primarily due to gas dissociation and gas evolution from the walls enclosing that region. As the plasma evolves to a quasi-steady state or on (run) condition, the oscillator can typically stabilize within a period of 1 msec (or 1 atom transit time).

The oscillator according to the invention can be operated by application of a DC voltage which is pulsed between different power levels. According to one possibility, the grid of triode 26 can be pulsed from a voltage level which creates a strongly off condition of the triode to a voltage level which creates a strongly on condition. This allows the triode to alternate between a conductive state and a non-conductive state. One advantage thereof is that operation of the pulse circuitry can be effected at a low power level. It has been found that this approach has enabled generation of pulses with a repetition rate of between 0.001 Hz and 500 Hz with rise times as short as 30 microseconds and fall times as short 50 microseconds. Alternatively, such pulses can be provided by the DC power source. These pulses have a higher power content that allow for short pulse rise and fall times and hence high pulse repetition rates.

The bias shield and chuck introduce a different electrical coupling with the plasma and, hence, require modification to the equivalent electrical circuit. Of course, the load circuit as shown in FIG. 6 would be modified and the values for several components, i.e., the blocking capacitor, variable capacitor, etc., would change.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A system for converting DC power into a RF electromagnetic field for maintaining a plasma in a processing chamber, the system comprising:

a coil constructed to surround the processing chamber and configured to couple RF power into the plasma, said coil having two ends; and a RF power generator including a free-running oscillator having a DC power supply and a RF power output, said power output being connected to a load impedance which includes said coil, said RF power generator being constructed and arranged to supply RF current to said coil in order to generate the RF power that is coupled into the plasma, wherein:

said free-running oscillator comprises: a vacuum tube having a cathode, a plate and a grid; a grid-leak circuit connected to said grid; a feedback circuit coupled to said vacuum tube; and a DC supply circuit constructed and arranged to heat said cathode; and at least part of said coil is connected to form a part of said feedback circuit wherein:

said part of said coil that forms a part of said feedback circuit is spaced from at least one of said ends of said coil, said RF power generator further comprises a control circuit coupled to said vacuum tube and constructed and arranged to vary the RF power that is coupled into the plasma, and said control circuit comprises a control signal source constructed and arranged to apply a control signal to said vacuum tube grid.

2. The system according to claim 1, wherein said coil comprises a helical coil.

3. The system according to claim 1, wherein one end of said coil is grounded and the other end of said coil is open-circuited.

4. The system according to claim 1, wherein said vacuum tube is a triode.

5. The system according to claim 1, wherein said DC power supply produces a time varying DC voltage that varies the RF power that is coupled into the plasma.

6. The system according to claim 5, wherein the DC voltage is a time varying voltage having a repetition rate lower than the frequency of the RF power.

7. The system according to claim 5, wherein the DC voltage is a time varying voltage having a repetition rate lower than the frequency of the RF power.

8. The system according to claim 5, wherein the DC voltage has the form of a train of pulses or a sinusoid.

9. The system according to claim 5, wherein the DC voltage is in the form of a train of pulses, each pulse having a multi-level waveform.

10. The system according to claim 1, further comprising a temperature control assembly operatively associated with said coil and said vacuum tube and constructed and arranged to maintain said coil and said vacuum tube at selected temperatures.

11. A system for converting DC power into a RF electromagnetic field for maintaining a plasma in a processing chamber, the system comprising:
  a coil constructed to surround the processing chamber and configured to couple RF power into the plasma, said coil having two ends; and
  a RF power generator including a free-running oscillator having a DC power supply and a RF power output, said power output being connected to a load impedance which includes said coil, said RF power generator being operative for supplying constructed and arranged to supply RF current to said coil in order to generate the RF power that is coupled into the plasma, wherein:
    said free-running oscillator comprises: a vacuum tube having a cathode, a plate and a grid; a grid-leak circuit connected to said grid; a feedback circuit coupled to said vacuum tube; and a DC supply circuit constructed and arranged to heat said cathode; and
    at least part of said coil is connected to form a part of said feedback circuit wherein:
      said part of said coil that forms a part of said feedback circuit is spaced from at least one of said ends of said coil, and
      said DC power supply produces a time varying DC voltage that varies the RF power coupled into the plasma, and
      the DC voltage has the form of a train of pulses having rise times no more than 30 microseconds and fall times no more than 50 microseconds.

12. The system according to claim 11 wherein said RF power generator further comprises a control circuit coupled to said vacuum tube and constructed and arranged to vary the RF power that is coupled into the plasma, and wherein said control circuit comprises a control signal source constructed and arranged to apply a control signal to said vacuum tube grid.

13. The system according to claim 12 wherein the control signal has the form of a train of pulses or a sinusoid.

14. The system according to claim 11 wherein the DC voltage is in the form of a train of pulses, each pulse having a multi-level waveform.

15. A method for converting DC power into a RF electromagnetic field for maintaining a plasma in a processing chamber, the method comprising:
  placing a helical coil around the processing chamber for coupling RF power into the plasma;
  providing a RF power generator including a free-running oscillator having a vacuum tube constituting an active component of the RF power generator, a feedback circuit coupled to said vacuum tube, a DC power input and an RF power output;
  connecting the RF power output to a load impedance which includes the helical coil for supplying RF current to the helical coil and connecting at least part of the helical coil to form a part of the feedback circuit; and
  introducing an ionizable gas into the chamber and delivering DC power to the DC power input in order to activate the oscillator to generate the RF power that is coupled into the plasma, wherein a modified Hartley oscillator is employed to enable automatic transition between start and run conditions without retuning.

16. The method according to claim 15, further comprising varying the density of the plasma in the chamber.

17. The method according to claim 16, wherein varying the density of the plasma in the chamber comprises varying the magnitude of the RF power coupled into the plasma.

18. The method according to claim 17, wherein varying the magnitude of the RF power coupled into the plasma comprises varying the magnitude of the DC power to the DC power input.

19. The method according to claim 16, wherein varying the density of the plasma in the chamber comprises varying the pressure of gas in the chamber.

20. The method according to claim 16 wherein the vacuum tube has a control grid, wherein varying the density of the plasma in the chamber comprises applying a variable amplitude control signal to the grid, and wherein providing a RF power generator comprises providing a RF power generator having a control circuit coupled to said vacuum tube and constructed and arranged to vary the RF power that is coupled into the plasma.

21. The method according to claim 20 wherein applying a variable amplitude control signal to the grid comprises applying a time varying signal having a repetition rate lower than the frequency of the RF power.

22. The method according to claim 21 wherein applying a time varying signal comprises applying a control signal that has the form of a train of pulses or a sinusoid.

23. The method according to claim 21 wherein applying a time signal comprises applying a control signal that has the form of a train of pulses, each pulse having a multi-level waveform.

* * * * *